US008873321B2

(12) United States Patent
Katoch

(10) Patent No.: US 8,873,321 B2
(45) Date of Patent: Oct. 28, 2014

(54) BOOSTING SUPPLY VOLTAGE

(75) Inventor: Atul Katoch, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 139 days.

(21) Appl. No.: 13/403,425

(22) Filed: Feb. 23, 2012

(65) Prior Publication Data

US 2013/0223174 A1 Aug. 29, 2013

(51) Int. Cl.
*G11C 7/02* (2006.01)

(52) U.S. Cl.
USPC ...... 365/207; 365/205; 365/210.12; 365/226; 365/203

(58) Field of Classification Search
CPC ............ G11C 7/06; G11C 7/062; G11C 7/08; G11C 7/065
USPC ...................... 365/207, 205, 210.12, 226, 203
See application file for complete search history.

(56) References Cited

U.S. PATENT DOCUMENTS

2003/0137863 A1* 7/2003 Takemura et al. .............. 365/63
2008/0298150 A1* 12/2008 Takahashi ..................... 365/207
2012/0275242 A1* 11/2012 Katoch et al. ............ 365/189.09

* cited by examiner

*Primary Examiner* — Han Yang
(74) *Attorney, Agent, or Firm* — Lowe Hauptman & Ham, LLP

(57) ABSTRACT

A data split between a first data line and a second data line is caused to develop. At least one of the following sets of steps is performed: 1) a first power supply line of a sense amplifier is caused to rise towards a first power supply voltage value, and when the first power supply line reaches a first predetermined voltage value, the first power supply is caused to rise above the first power supply voltage value; and 2) a second power supply line of the sense amplifier is caused to fall towards a second power supply voltage value, and when the second power supply line reaches a second predetermined voltage value, the second power supply line is caused to fall below the second power supply voltage value.

20 Claims, 5 Drawing Sheets

BOOSTING SUPPLY VOLTAGE

FIELD

The present disclosure is related to boosting a supply voltage.

BACKGROUND

Power supply voltage values have been scaling with the technology nodes to adapt to the thinner gate oxides of transistors. A larger variation in the threshold voltage of the transistors results in a degradation in performance of sense amplifiers at lower temperatures and lower power supply voltage values. In an embedded dynamic random access memory (eDRAM) solution, to improve sensing performance, two power domains are used, which include two power supply rails and two corresponding ground rails. As a result, the system using the eDRAM is complicated. For example, in some approaches, one power domain is used for the input-output interface, and another power domain is used for other memory related circuits. Level shifters are also used to level shift signals from one power domain to the other power domain. The two-power domain system also results in higher power consumption.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
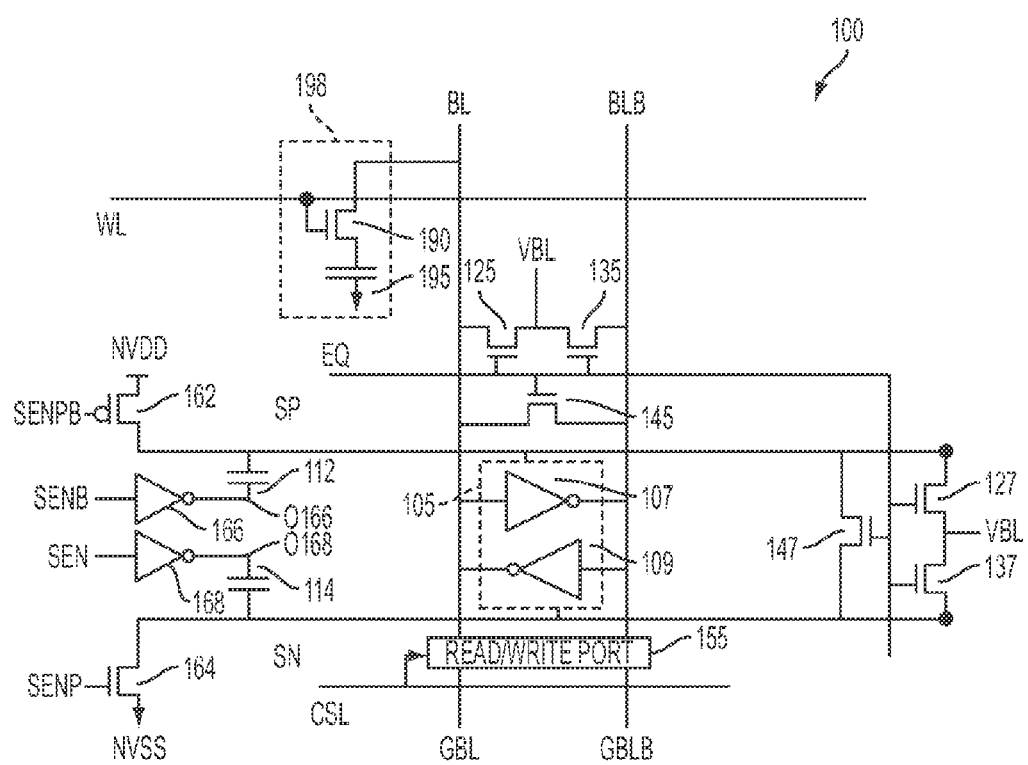
FIG. 1 is a diagram of a memory circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The supply voltage value of the sense amplifier is boosted during sensing to improve sensing performance. In some embodiments, a single power supply source is used for both an operational voltage and a sensing voltage. As a result, the need for separate power supply sources, for example, one for memory related circuits and one for the input-output (IO) interface, is eliminated. The power consumption is reduced because one, instead of two, power supply is used. The need for level shifters at the IO interface is also eliminated.

Exemplary Circuit

FIG. 1 is a diagram of a memory circuit 100, in accordance with some embodiments.

Column select signal CSL and read/write port 155 enable the data transfer between the pair of local bit lines BL and BLB and the pair of global bit lines GBL and GBLB, respectively.

Signal EQ and transistors 125, 135, and 145 are used to pre-charge and equalize bit lines BL and BLB. For example, when signal EQ is applied with a high logical value, transistors 125, 135, and 145 are turned on, enabling bit lines BL and BLB to be at the same voltage level VBL at the drains of transistors 125 and 135. Stated differently, bit lines BL and BLB are pre-charged and equalized to voltage VBL. The term "pre-charge" is commonly used to refer to charging before reading and/or writing.

Bit cell 198 includes pass gate transistor 190 and memory cell 195. Transistor 190 allows access between local sense amplifier 105 and memory cell 195 through the pair of bit lines BL and BLB. In some embodiments, each of bit lines BL and BLB is connected to an equal number of bit cells 198, but only one bit cell 198 connected to a bit line BL is shown in FIG. 1 for illustration. In some embodiments, memory cell 195 is a capacitor storing charges. When memory cell 195 is electrically connected to a bit line BL as shown in FIG. 1, memory cell 195 shares the same charge with bit line BL. Depending on the charge representing the logical value of memory cell 195, bit line BL is pulled one way or another. For example, if memory cell 195 stores a logical low value, bit line BL is pulled towards ground or reference voltage VSS. Conversely, if memory cell 195 stores a high logical value, bit line BL is pulled towards operational voltage VDD. After memory cell 195 and bit line BL are electrically coupled together, a bit line split or the voltage difference between bit line BL and bit line BLB starts to develop. The bit line split is also called a data split.

Bit lines BL and BLB serve as both data input and output for memory cell 195 and for sense amplifier 105. In some embodiments, in a write cycle, applying a logical value to a first bit line, and the opposite logical value to the other bit line, enables writing the logical value at the first bit line to memory cell 195. In a read cycle, sensing or reading the logical values at bit lines BL and BLB reveals the data stored in memory cell 195. For example, once the bit line split is sufficiently large, sense amplifier 105 amplifies the bit line split, providing a full swing signal on bit lines BL and BLB that represents the data to be read from memory cell 195. For example, if memory cell 195 stores a logical high value, sensing bit line BL reveals a high logical value. Conversely, if memory cell 195 stores a logical low value, sensing bit line BL reveals a logical low value. In some embodiments, a logical low value for a full swing signal is at reference voltage VSS while a logical high value for a full swing signal is at operational voltage VDD. Bit lines BL and BLB are commonly called data lines.

Word line WL is used to turn on or off memory pass gate transistor 190 to allow access to memory cell 195 through transistor 190. In FIG. 1, bit cell 198 is electrically coupled to bit line BL for illustration. Depending on implementations in a memory array, some bit cells 198 are connected to bit line BL while some other bit cells 198 are connected to bit line BLB. In FIG. 1, when word line WL at the gate of transistor 190 is applied with a logical low value, transistor 190 is turned off. The corresponding memory cell 195 is therefore electrically disconnected from bit line BL or from sense amplifier 105. When word line WL is applied with a logical high value, however, transistor 190 is turned on. The corresponding memory cell 195 is electrically connected to bit line BL.

Local sense amplifier 105 includes a cross-coupled or sensing pair 107 and 109. When a bit line split of bit lines BL and BLB is sufficiently developed, sense amplifier 105 is turned on for the sensing pair to sense or amplify the bit line split and generate a full swing signal on local bit lines BL and BLB that represent the data read from memory cell 195. In some embodiment, after sensing, sense amplifier 105 also restores the read data to memory cell 195, and sends the data on bit lines BL and BLB to the corresponding global bit lines GBL and GBLB. In some embodiments, sense amplifier is turned on when the bit line split reaches a predetermined voltage value, which varies depending on the technology node, the ability of sense amplifier 105 to sense or differentiate the voltage levels of bit lines BL and BLB. In some embodiments, sense amplifier 105 is able to sense when the difference in the voltage levels of bit lines BL and BLB reaches a sensing threshold voltage, which, for illustration, is called Vsense.

Signals SP and SN are used to turn on or off sense amplifier 105. Signal SP is commonly called the positive supply voltage while signal SN is commonly called the negative supply voltage, even though signal SN has a positive voltage in many situations. In general, when signals SP and SN are at a same voltage level, amplifier 105 is turned off. In some embodiments, both signals SP and SN are set at voltage VBL at half of operational voltage VDD to turn off sense amplifier 105. In contrast, when signal SP is at an operational voltage VDD and signal SN is at a ground reference voltage level VSS, sense amplifier 105 is turned on.

Transistors 127, 237, and 147 are used to pre-charge and equalize signal signals SP and SN. Transistors 127, 137, and 147 pre-charge and equalize signals SN and SP in a manner similar to transistors 125, 135, and 145 pre-charge and equalize bit lines BL and BLB. For example, when signal EQ is logically high, transistors 127, 137, and 147 are turned on, enabling signals SP and SN to be at the same voltage level VBL at the drains of transistors 127 and 137.

Signal SENPB and PMOS transistor 162 provide the voltage level for signal SP. For example, when signal SENPB is logically high, transistor 162 is turned off and electrically disconnected from signal SP. But when signal SENPB is logically low, transistor 162 is turned on. As a result, signal SP at the drain of PMOS transistor 162 is pulled to operational voltage VDD (not labeled) at node NVDD.

In some embodiments, sensing occurs when the bit line split is sufficient for sense amplifier 105 to recognize the difference between the voltage levels of bit lines BL and BLB. For illustration, sensing occurs when bit line BL is rising and bit line BLB is falling. In some embodiments, to speed up the rising edge of bit line BL and the falling edge of bit line BLB, signal SP is raised higher than operational voltage VDD and/or signal SN is lowered below reference voltage VSS. For illustration, raising signal SP and/or lowering signal SN is called boosting.

Inverter 166 inverts signal SENB to provide signal O166, which, together with capacitor 112, boosts signal SP. In some embodiments, inverter 166 is time adjustable such that signal O166 is delayed in order for signal SP to be boosted at the desired time. As a result, the rising edge of bit line BL and the falling edge of bit line BLB are sped up at the desired time. For example, during a sensing cycle, output O166 is delayed so that signal SP is boosted, and, by the time sense amplifier 105 is able to differentiate the difference between the voltage levels of bit lines BL and BLB, the rising edge of bit line BL and the falling edge of bit line BLB have been sped up. In other words, signal SP is raised such that the rise time of bit line BL and the fall time of bit line BLB have been improved when sense amplifier 105 is able to differentiate the difference between two voltage levels of bit lines BL and BLB. Other mechanisms to control the time to boost signal SP are within the scope of various embodiments. In some embodiments, signal SP is boosted when signal SP reaches a predetermined voltage value SPpred (not labeled), which is calculated in various ways. In some embodiments, voltage value SPpred is based on operational voltage VDD, such as 70%, 80%, 90% or 100% of operational voltage VDD. In some other embodiments, voltage value SPpred is a fixed voltage value below operational voltage VDD, such as VDD−50 mV, VDD−100 mV, etc. In some embodiments, voltage value SPpred is obtained by simulation. For example, the voltage value of signal SP is varied, and the bit line split is observed. When the bit line split reaches the value of voltage Vsense at which sense amplifier 105 is able to differentiate the voltage level difference between bit lines BL and BLB, the predetermined voltage value SPpred is selected. For illustration, voltage value SPpred is operational voltage VDD. In the boosting period, signal SENPB is applied with a logical low value to turn on PMOS transistor 162 that pulls signal SP to voltage VDD at node NVDD at the source of transistor 162. When signal SP reaches the voltage level of operational voltage VDD, signal SENPB is applied with a high logical value to turn off PMOS transistor 162. Further, a low logical value is applied to signal SENB that provides a high voltage level for signal O166 to charge capacitor 112. As a result, signal SP is raised or boosted.

Inverter 168 inverts signal SEN to provide signal O168, which, together with capacitor 114, negatively boosts signal SN at the desired time. In some embodiments, inverter 168 is time adjustable such that signal O168 is delayed in order for signal SN to be boosted at the desired time. As a result, the rising edge of bit line BL and the falling edge of bit line BLB are sped up at the desired time. For example, during a sensing cycle, output O168 is delayed so that signal SN is boosted, and, by the time sense amplifier 105 is able to differentiate the difference between the voltage levels of bit lines BL and BLB, the rising edge of bit line BL and the falling edge of bit line BLB have been sped up. In other words, signal SN is lowered such that the rise time of bit line BL and the fall time of bit line BLB have been improved when sense amplifier 105 is able to differentiate the difference between two voltage levels of bit lines BL and BLB. Other mechanisms to control the time to boost signal SN are within the scope of various embodiments. In some embodiments, signal SN is boosted when signal SN reaches a predetermined voltage value SNpred (not labeled), which is calculated in various ways. In some embodiments, voltage value SNpred is based on operational voltage VDD and VSS, such as 30%, 20%, 10% or 0% of operational voltage VDD. When voltage SNPred is at 0% of voltage VDD, voltage value SNPred is at voltage VSS. In some other embodiments, voltage value SNpred is a fixed voltage above operational voltage VSS, such as VSS+50 mV, VSS+100 mV, etc. In some embodiments, voltage value SNpred is obtained by simulation. For example, the voltage value of signal SN is varied, and the bit line split is observed. When the bit line split reaches the value of voltage Vsense at which sense amplifier 105 is able to differentiate the voltage level difference between bit lines BL and BLB, the predetermined voltage value SNpred is selected. For illustration, voltage value SNpred is voltage VSS. In the boosting period, signal SENP is applied with a high logical value to turn on NMOS transistor 164 that pulls signal SN to voltage VSS at node NVSS at the source of transistor 164. When signal SN reaches the voltage level of operational voltage VSS, signal SENP is applied with a low logical value to turn off NMOS transistor 164. Further, a logical high value is applied to signal SEN that causes signal O168 to fall. Because signal O168 is capacitively coupled to signal SN, the falling transition of signal O168 causes signal SN to be lowered than voltage VSS. In other words, signal SN is lowered or boosted.

Inverters 166 and 168 are used for illustration. Other mechanisms providing voltages to boost signal SP and SN are within the scope of various embodiments. For example, a first buffer, a first switch, etc., provides a high voltage level to capacitor 112 to raise signal SP. Similarly, a second buffer, a second switch, etc., provides a low voltage level to capacitor 114 to lower signal SN.

Various embodiments are advantageous over other approaches because the embodiments provide mechanisms, such as capacitor 112 and inverter 166, to speed up the rise time of bit line BL and the fall time of bit line BLB during sensing, by boosting signal SP. Similarly, various embodiments are advantageous by providing mechanism, such as capacitor 114 and inverter 168, to speed up the rise time of bit line BL and the fall time of bit line BLB during sensing, by boosting signal SN. As a result, sensing the difference between the voltage level of bit lines BL and BLB is performed at a time earlier than the situation in which the rise time and the fall time of the bit lines are not sped up. In the above illustration, signal SP is raised and signal SN is lowered. In various other embodiments, either signal SP is raised or signal SN is lowered.

In some embodiments related to VSS sensing, signal SP is raised while signal SN stays at a same voltage level. As a result, boosting is applied to signal SP, but not to signal SN. For example, in some embodiments, before activating sense amplifier 105, signals SN and SP and bit lines BL and BLB are pre-charged and equalized to reference voltage VSS. When the bit line split is sufficient to turn on sense amplifier 105, signal SP is raised to operational voltage VDD. In some embodiments, signal SP is also boosted to a voltage level higher than operational voltage VDD to speed up the rise time of bit line BL and the fall time of signal BLB. Signal SN in those embodiments, however, is not boosted.

In some embodiments, whether signal SP and/or signal SN is boosted or not is based on the threshold voltage Vt of transistors in sensing pairs 107 and 109. For example, in some embodiments, if threshold voltage Vt is below a predetermined or an expected threshold voltage value, boosting is not invoked because sense amplifier 105 is able to amplify the data within an acceptable time. If, however, threshold voltage Vt is at the expected voltage value, then each of signals SP and SN is boosted by about 100 mV. But if threshold voltage Vt is higher than the predetermined threshold voltage value, each of signals SP and SN is boosted by about 200 mV, etc.

Exemplary Waveforms

Figure 2:
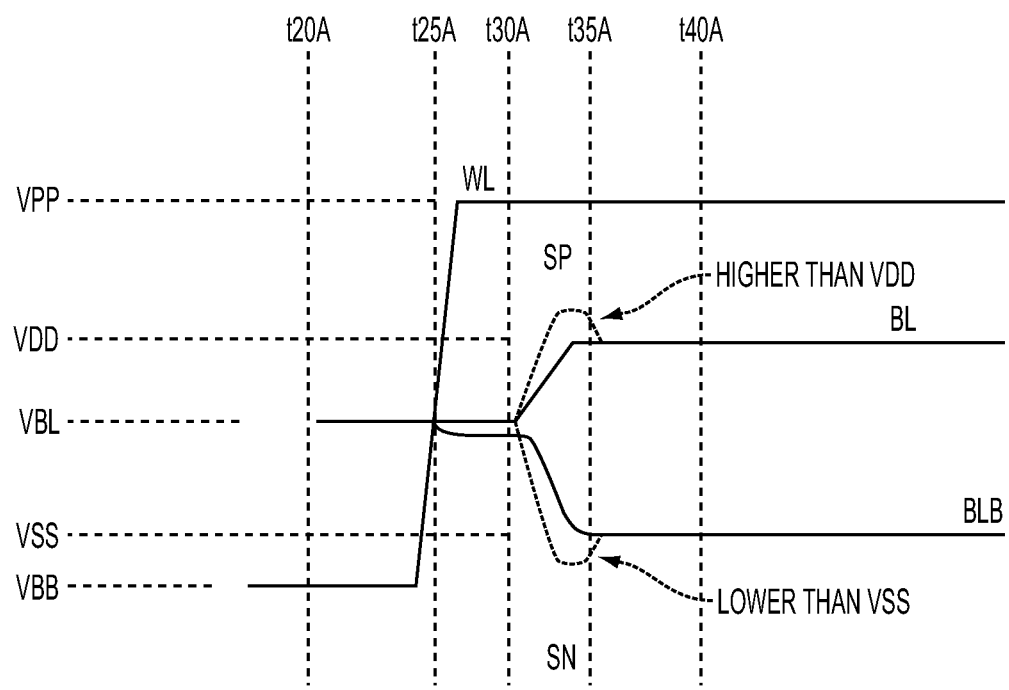
FIG. 2 is a graph of waveforms illustrating operations of the memory circuit in FIG. 1, in accordance with some embodiments.

FIG. 2 is a graph of waveforms illustrating an operation of circuit 100, in accordance with some embodiments. In the illustration with reference to FIG. 2, some signals are mentioned, but, to avoid obscuring the graph, the waveforms for some signals are not shown. In some embodiments, the low and high voltage values for word line WL is voltage VBB and VPP, which, in some embodiments, are −0.5 V and 1.5 V, respectively. The low and high voltage values for bit lines BL and BLB are reference voltage VSS and operational VDD, which in some embodiments, are 0 V and 0.85 V, respectively. The pre-charge level for signals SP and SN and bit lines BL and BLB is voltage VBL, which, in some embodiments, is half of voltage VDD.

Between times t20A and t25A, signals SP and SN, and bit lines BL and BLB are pre-charged and equalized to voltage VBL. In some embodiments signal EQ is activated with a logical high value to pre-charge and equalize signals SP and SN, and bit lines BL and BLB.

At time t25A, after pre-charge and equalization are complete, word line WL is activated with a high logical value. As a result, memory cell 195 in FIG. 1 is electrically coupled to bit line BL. The bit line split between bit lines BL and BLB therefore starts to develop. In the illustration in FIG. 2, bit line BLB is pulled down towards reference voltage VSS while bit line BL stays at the same level.

At time t30A, the bit line split develops sufficiently for sense amplifier 105 to be turned on. In some embodiments, to turn on sense amplifier 105, signal SENPB is applied with a low logical value to turn on PMOS transistor 162, and signal SENP is applied with a high logical value to turn on NMOS transistor 164. As a result, signal SP is pulled towards operational voltage VDD at the source of PMOS transistor 162, and signal SN is pulled towards reference voltage VSS at the source of NMOS transistor 164.

At also about time t30A, signal SENB is activated with a low logical value, and signal SENPB is applied with a positive pulse to turn off PMOS transistor 162 for a short time until time t35A The output of inverter 166 therefore provides a high logical value to boost signal SP through capacitor 112 to a level higher than operational voltage VDD as shown between times t30A and t35A. Boosting signal SP speeds up the rising edge of bit line BL and the falling edge of bit line BLB. Similarly, at also about time t30A, signal SEN is activated with a high logical value, and signal SENP is applied with a negative pulse to turn off NMOS transistor 164 for a short time until time t35A. The output of inverter 168 therefore provides a low logical value to boost signal SN to a level lower than reference voltage VSS as shown between times t30A and t35A. Boosting signal SN speeds up the rising edge of bit line BL and the falling edge of bit line BLB. Because the rising edge of bit line BL and the falling edge of bit line BLB are sped up, the bit line split reaches the sensing threshold voltage Vsense of sense amplifier 105 faster. As a result, sensing occurs at an earlier time than the situation when the rising edge of bit line BL and the falling edge of bit line BLB are not sped up.

At time t35A, signals SP and SN return to the normal operational voltage VDD and reference voltage VSS. In other words, boosting signals SP and SN ends.

At time t40A, after bit lines BL and BLB reach their full swing signals, the data on bit lines BL and BLB are processed accordingly, depending on whether the operation is a read or a write operation. For example, if the operation is a read operation, the data on bit lines BL and BLB are transferred to the corresponding global bit lines GBL and GBLB to be sent to other circuits outside of circuit 100. In contrast, if the operation is a write operation, the data on bit lines BL and BLB are written to the corresponding memory cell, such as memory cell 195 in circuit 100. In some embodiments, a write back occurs after reading. For example, after the data in memory cell 195 causes the bit line split as explained above, the data on bit lines BL and BLB, in addition to being sent to global bit lines GBL and GBLB for reading, are also written back to memory cell 195.

Exemplary Circuit—Other Embodiments

Figure 3:
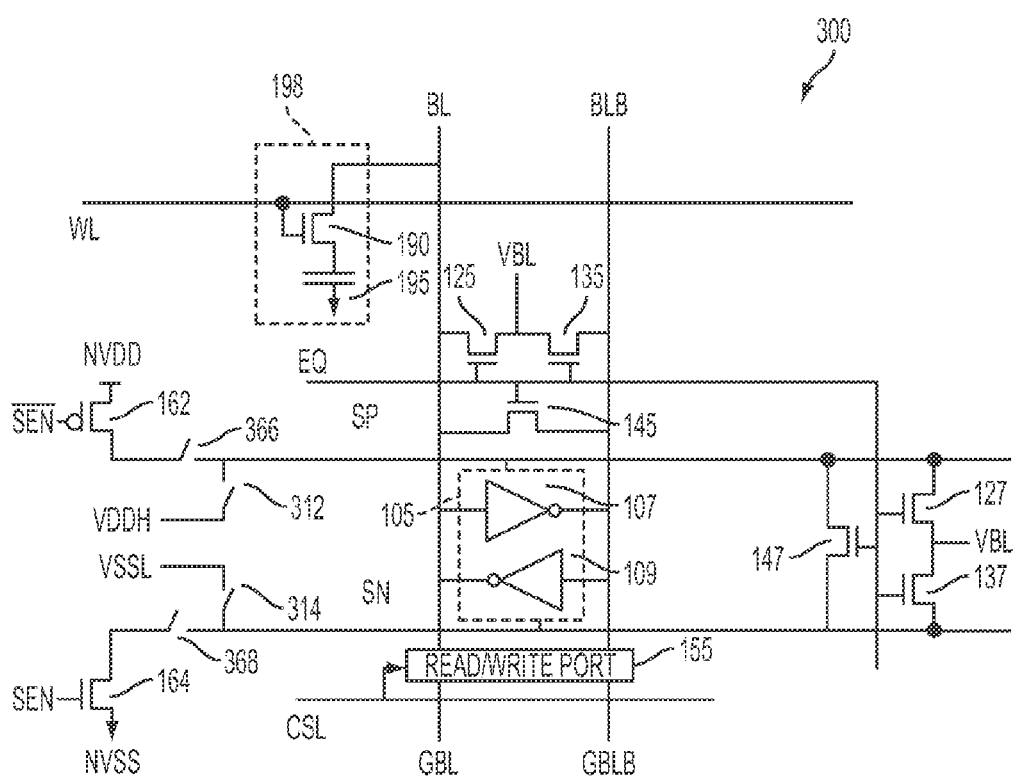
FIG. 3 is a diagram of another memory circuit, in accordance with some embodiments.

FIG. 3 is a diagram of a memory circuit 300, in accordance with some embodiments.

Compared with circuit 100, circuit 300 does not include inverter 166, inverter 168, capacitor 112, and capacitor 114. Circuit 300 instead includes switches 366, 312, 368, and 314. Circuit 300 also includes a voltage source providing voltage VDDH and a voltage source providing voltage VSSL. In some embodiment, voltage VDDH is higher than voltage VDD, and is used to boost signal SP. For example, in some embodiments, during sensing, switch 366 is open while switch 312 is closed. As a result, signal SP receives voltage VDDH. Stated differently, signal SP is boosted. In contrast, during operations other than sensing, switch 366 is closed while switch 312 is open. As a result, when PMOS transistor 162 is turned on, signal SP receives normal operational voltage VDD at node NVDD at the source of PMOS transistor 162.

Similarly, in some embodiments, voltage VSSL is lower than reference voltage VSS, and is used to negatively boost signal SN. For example, in some embodiments, during sensing, switch 368 is open while switch 314 is closed. As a result, signal SN receives voltage VSSL. Stated differently, signal SN is negatively boosted. In contrast, during operations other than sensing, switch 368 is closed while switch 314 is open. As a result, when PMOS transistor 164 is turned on, signal SN receives normal reference voltage VSS at node NVSS at the source of NMOS transistor 164.

Exemplary Waveforms—Other Embodiments

Figure 4:
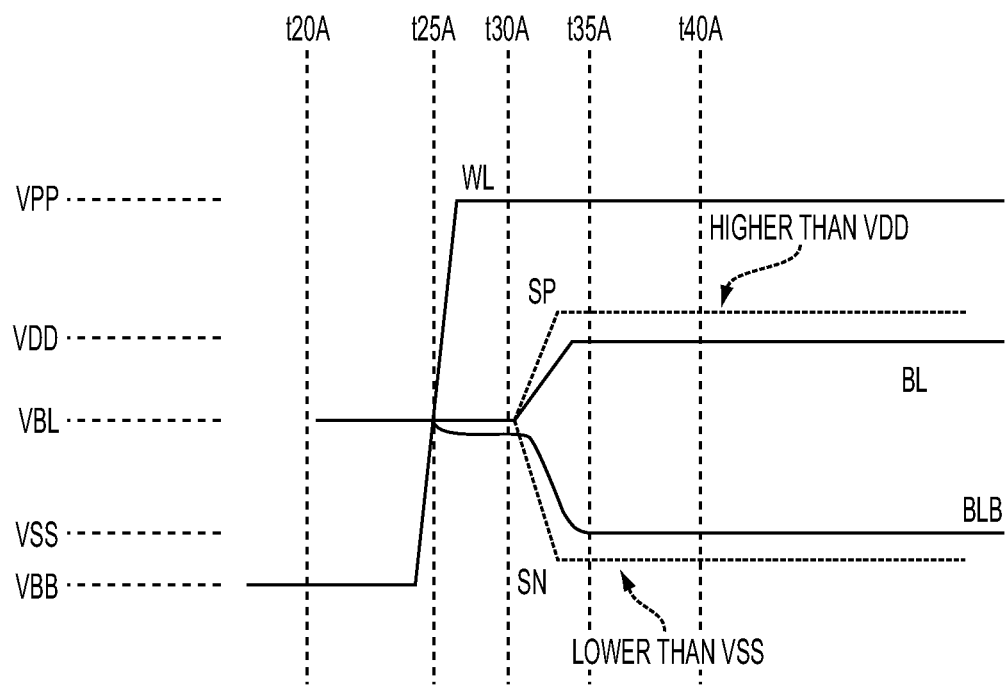
FIG. 4 is a graph of waveforms illustrating operations of the memory circuit in FIG. 3, in accordance with some embodiments.

FIG. 4 is a graph of waveforms illustrating operations of circuit 300, in accordance with some embodiments.

Compared with the waveforms in FIG. 2, signal SP in FIG. 4 is shown continuously higher than voltage VDD after time t35A. In such a condition, switch 366 continues to be open while switch 312 continues to be closed after time t35A. In some embodiments, boosting is turned off after reading or writing is complete. For example, switch 366 is closed and switch 312 is open so that signal SP returns to normal operational voltage VDD after time t35A.

Similarly, signal SN in FIG. 4 is shown continuously lower than voltage VSS after time t35A. In such a condition, switch 368 continues to be open while switch 314 continues to be closed after time t35A. In some embodiments, boosting is turned off after reading or writing is complete. For example, switch 368 is closed and switch 314 is open so that signal SN returns to normal reference voltage VSS after time t35A.

In some embodiments, boosting signal SP and/or signal SN stops based on the bit line split between bit line BL and bit line BLB. For example, when the bit line split reaches the full voltage swing. In other words, when bit line BL reaches voltage VDD and bit line BLB reaches voltage VSS in the example of FIG. 4.

Exemplary Method

Figure 5:
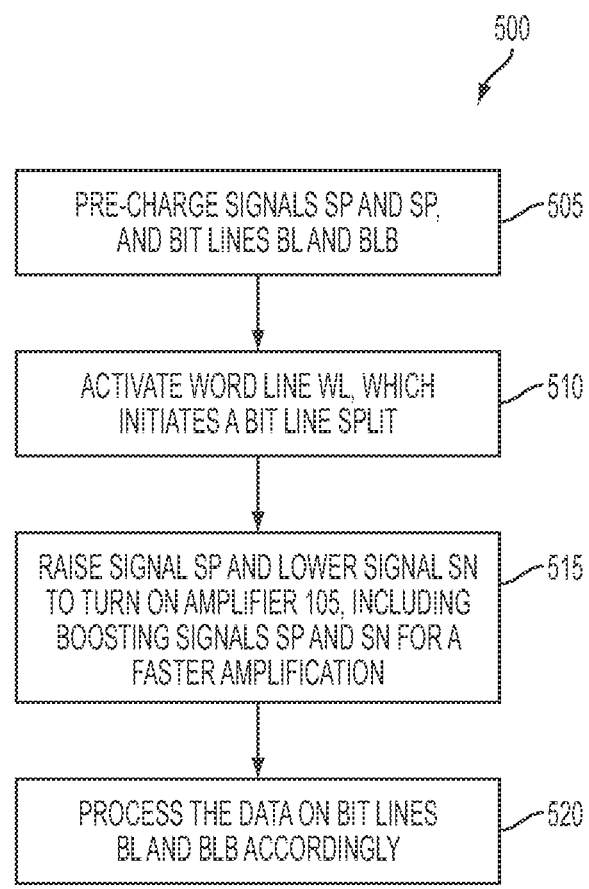
FIG. 5 is a flowchart of a method illustrating operations of the memory circuit in FIG. 1, in accordance with some embodiments.

FIG. 5 is a flowchart of a method 500 illustrating an operation of circuit 100, in accordance with some embodiments.

In step 505, signal EQ is activated to pre-charge and equalize signals SP and SN and bit lines BL and BLB. As a result, signals SP and SN, and bit lines BL and BLB are at the pre-charged voltage level or voltage VBL. In some embodiments, voltage VBL is half of operational voltage VDD. In the embodiments where VSS sensing is used, voltage VBL is 0 V.

In step 510, when signals SP and SN and bit lines BL and BLB are stable at the pre-charge level of voltage VBL, word line WL is activated. As a result, bit line BL is electrically coupled to memory cell 195, and the bit line split starts to develop.

In step 515, after the bit line split reaches a predetermined voltage value, sense amplifier 105 is turned on. Effectively, in some embodiments, signal SP is raised and signal SN is lowered. The bit line split therefore continues to develop. For example, in FIG. 2, bit line BL is pulled towards operational voltage VDD while bit line BLB is pulled towards reference voltage VSS. In addition, because of capacitor 112 and output O166 of inverter 166, signal SP is boosted or raised higher than operational voltage VDD. Similarly, because of capacitor 114 and output O168 of inverter 168, signal SN is boosted or lowered below reference voltage VSS. As a result of signals SP and SN being boosted, the rise time of bit line BL and the fall time of bit line BLB are sped up. Consequently, the bit line split reaches the sensing threshold voltage Vsense of the sense amplifier faster than the situation in which the rise time of bit line BL and the fall time of bit line BLB are not sped up. Effectively, sensing is performed earlier.

In step 520, depending on whether the operation is reading or writing, the data is processed accordingly.

In the embodiments of FIG. 1, signal SP is raised and signal SN is lowered. Either signal SP being raised or signal SN being lowered is within the scope of various embodiments.

Circuit 100 is used in method 500 for illustration. The operation of circuit 300 is similar, and should be recognizable by persons of ordinary skill in the art in view of this disclosure. For example, in step 515, signal SP is raised and boosted by closing switch 312 and opening switch 366. As a result, signal SP receives voltage VDDH. Similarly, signal SN is lowered and boosted by closing switch 314 and opening switch 368. As a result, signal SN receives voltage VSSL.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low and/or high logical values of various signals used in the above description are also for illustration purposes. Various embodiments are not limited to a particular logical value when a signal is activated and/or deactivated. Selecting different logical values is within the scope of various embodiments.

In some embodiments, a first data line and a second data line are caused to have a data voltage level. A first power supply line and a second power supply line of a sense amplifier are caused to have a power supply voltage level. A data split between the first data line and the second data line is caused to develop. At least one of the following steps is performed: 1) the first power supply line is caused to rise towards a first power supply voltage value, and when the first power supply line reaches a first predetermined voltage value, the first power supply is caused to rise above the first power supply voltage value; and 2) the second power supply line is caused to fall towards a second power supply voltage value, and when the second power supply line reaches a second predetermined voltage value, the second power supply line is caused to fall below the second power supply voltage value.

In some embodiments, a first data line and a second data line are caused to have a data line voltage value. A first power supply line of a sense amplifier and a second power supply line of the sense amplifier are caused to have a supply voltage value. A data split of the first data line and the second data line is caused to develop. The sense amplifier is turned on to cause the data split to further develop. Based on a threshold voltage value of a transistor of the sense amplifier, at least one of the following steps is performed: boosting a voltage level of the first power supply line and boosting a voltage level of the second power supply line.

In some embodiments, a circuit comprises a pair of data lines, a power supply line of a sense amplifier, a power circuit, a boosting circuit, and means for turning on and turning off the boosting circuit. The power circuit is coupled to the power supply line and is configured to provide a voltage value to the power supply line. The boosting circuit is coupled to the power supply line and configured to provide a boosted voltage value to the power supply line. The means for turning on and turning off the boosting circuit is based on at least one of a threshold voltage of a transistor of the sense amplifier, a voltage level of the power supply line, a voltage difference of the pair of data lines, and a sensing threshold voltage of the amplifier.

In various embodiments, a transistor functions as a switch. A switching circuit used in place of a transistor is within the scope of various embodiments. Switching devices, networks, or the like are within the scope of various embodiments. The various figures show discrete capacitors for illustration. Equivalent circuitry may be used. For example, a capacitive device, circuitry or network, such as a combination of capacitors, capacitive devices, circuitry, etc., can be used in place of a capacitor.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
    causing a first data line and a second data line to have a data voltage level;
    causing a first power supply line and a second power supply line of a sense amplifier to have a power supply voltage level;
    causing a data split between the first data line and the second data line to develop; and
    performing at least one of the following steps:
        causing the first power supply line to rise towards a first power supply voltage value, and when the first power supply line reaches a first predetermined voltage value, causing the first power supply to rise above the first power supply voltage value; and
        causing the second power supply line to fall towards a second power supply voltage value, and when the second power supply line reaches a second predetermined voltage value, causing the second power supply line to fall below the second power supply voltage value,
    wherein at least one of the following conditions is met;
        causing the first power supply line to rise above the first power supply voltage value includes charging a first capacitive device coupled to the first power supply line; or
        causing the second power supply line to fall below the second power supply voltage value includes charging a second capacitive device coupled to the second power supply line.

2. The method of claim 1, wherein
    the first predetermined voltage value is determined based on the first power supply voltage value; and
    the second predetermined voltage value is determined based on the second power supply voltage value.

3. The method of claim 1, wherein
    the first predetermined voltage value is based on a first value of the data split and/or a sensing threshold value of the sense amplifier; and
    the second predetermined voltage value is based on a second value of the data split and/or the sensing threshold value of the sense amplifier.

4. The method of claim 1, wherein at least one of the following conditions is met:
    providing a first capacitive voltage to the first capacitive device coupled to the first power supply line when the first power supply line reaches the first predetermined voltage value; or
    providing a second capacitive voltage to the second capacitive device coupled to the second power supply line when the second power supply line reaches the second predetermined voltage value.

5. The method of claim 1, wherein at least one of the following conditions is met:
    when the first power supply line reaches the first predetermined voltage value, electrically disconnecting a first voltage source that causes the first power supply line to rise towards the first power supply voltage value, and providing a first voltage value higher than the first power supply voltage value to the first power supply line; or
    when the second power supply line reaches the second predetermined voltage value, electrically disconnecting a second voltage source that causes the second power supply line to fall towards the second power supply voltage value, and providing a second voltage value lower than the second power supply voltage value to the second power supply line.

6. The method of claim 5, wherein at least one of the following conditions is met:
    after providing the first voltage value to the first power supply line for a first period of time, stopping providing the first voltage value to the first power supply line; or
    after providing the second voltage value to the second power supply line for a second period of time, stopping providing the second voltage value to the second power supply line.

7. The method of claim 6, wherein at least one of the following conditions is met:
    stopping providing the first voltage value to the first power supply line is done based on a voltage split between the first data line and the second data line; or
    stopping providing the second voltage value to the second power supply line is done based on the voltage split between the first data line and the second data line.

8. The method of claim 1, wherein
    the step of causing the first power supply to rise above the first power supply voltage value and/or the step of causing the second power supply to fall below the second power supply voltage value is based on a value of a threshold voltage of a transistor in the sense amplifier.

9. A method comprising:
    causing a first data line and a second data line to have a data line voltage value;
    causing a first power supply line of a sense amplifier, and a second power supply line of the sense amplifier to have a supply voltage value;
    causing a data split of the first data line and the second data line to develop;
    turning on the sense amplifier to cause the data split to further develop; and based on a threshold voltage value of a transistor of the sense amplifier, performing at least one of the following steps:
- boosting a voltage level of the first power supply line by providing a first capacitive voltage value to a first capacitive device coupled to the first power supply line, and
- boosting a voltage level of the second power supply line by providing a second capacitive voltage value to a second capacitive device coupled to he second power supply line.

10. The method of claim 9, wherein
turning on the sense amplifier comprises causing the first power supply line to have an operational voltage value of the first power supply line and causing the second power supply line to have an operational voltage value of the second power supply line, wherein the operational voltage value of the first power supply line differs from the operational voltage value of the second power supply line;
boosting the voltage level of the first power supply line comprises causing the first power supply line to have a voltage value higher than the operational voltage value of the first power supply line; and
boosting the voltage level of the second power supply line comprises causing the second power supply line to have a voltage value lower than the operational voltage value of the second power supply line.

11. The method of claim 10, wherein
causing the first power supply line to have a voltage value higher than the operational voltage value of the first power supply line is performed when the first power supply line reaches a predetermined voltage value of the first power supply line; and
causing the second power supply line to have a voltage value lower than the operational voltage value of the first power supply line is performed when the second power supply line reaches a predetermined voltage value of the second power supply line.

12. The method of claim 10, wherein
the predetermined voltage value of the first power supply line is determined based on the operational voltage value of the first power supply line; and
the predetermined voltage value of the second power supply line is determined based on the operational voltage value of the second power supply line.

13. The method of claim 10, wherein
the predetermined voltage value of the first power supply line and/or the predetermined voltage value of the second power supply line are determined based on at least one of a voltage value of the data split and a sensing threshold voltage value of the sense amplifier.

14. The method of claim 9, wherein
boosting the voltage level of the first power supply line comprises electrically dis-connecting a first signal from the first power supply line and electrically coupling a second signal to the first power supply line; and
boosting the voltage level of the second power supply line comprises electrically dis-connecting a third signal from the second power supply line and electrically coupling a fourth signal to the second power supply line.

15. The method of claim 9, further comprising at least one of the following steps:
- stopping boosting the voltage level of the first power supply line after boosting the voltage level of the first power supply line for a first period of time; and
- stopping boosting the voltage level of the second power supply line after boosting the voltage level of the second power supply line for a second period of time.

16. A circuit comprising:
a pair of data lines;
a power supply line of a sense amplifier;
a power circuit comprising a transistor coupled to the power supply line and configured to provide a voltage value to the power supply line;
a boosting circuit comprising a capacitive device coupled to the power supply line and configured to provide a boosted voltage value to the power supply line; and
means for turning on and turning off the boosting circuit based on at least one of a threshold voltage of a transistor of the sense amplifier, a voltage level of the power supply line, a voltage difference of the pair of data lines, and a sensing threshold voltage of the sense amplifier.

17. The circuit of claim 16, wherein
the power circuit further comprises a first switch, wherein the transistor is configured to provide the voltage value to the power supply line when the first switch is closed; and
the boosting circuit further comprises a voltage line having the boosted voltage value and a second switch, wherein the second switch is configured to transfer the boosted voltage value to the power supply line.

18. The circuit of claim 16, wherein the capacitive device of the boosting circuit comprises:
a first end coupled to the power supply line;
a second end coupled to a charging circuit.

19. The circuit of claim 18, wherein the charging circuit comprises an inverter having an input end configured to receive a control signal and an output end coupled to the second end of the capacitive device of the boosting circuit.

20. The circuit of claim 16, wherein
the circuit further comprises:
another power supply line of the sense amplifier; and
another power circuit coupled to the another power supply line and configured to provide another voltage value to the another power supply line; and
at least one of the following conditions is met:
the voltage value is greater than the another voltage value, and the boosted voltage value is greater than the voltage value; or
the voltage value is less than the another voltage value, and the boosted voltage value is less than the voltage value.

* * * * *